United States Patent [19]

Iwasaki

[11] Patent Number: 5,051,702
[45] Date of Patent: Sep. 24, 1991

[54] AUTOMATIC PHASE CONTROLLING CIRCUIT

[75] Inventor: Kiyoshi Iwasaki, Tokyo, Japan
[73] Assignee: NEC Corporation, Tokyo, Japan
[21] Appl. No.: 406,359
[22] Filed: Sep. 12, 1989
[30] Foreign Application Priority Data Sep. 26, 1988 [JP] Japan ................. 63-241405

[51] Int. Cl.$^5$ .................. H03K 5/13; H03L 7/00
[52] U.S. Cl. ................................ 328/155; 331/25;
331/18; 328/109; 307/262
[58] Field of Search ............ 328/155, 133, 109;
331/18, 25, 1 R; 307/511, 262

[56] References Cited

U.S. PATENT DOCUMENTS

| | | | |
|---|---|---|---|
| 3,465,258 | 9/1966 | Wheatley, III | 328/155 |
| 3,621,405 | 11/1971 | Carlsen | 328/155 |
| 3,787,775 | 1/1974 | Lanning | 328/155 |
| 3,952,261 | 4/1976 | Hara et al. | 331/25 |

Primary Examiner—Stanley D. Miller
Assistant Examiner—Richard Roseen
Attorney, Agent, or Firm—Helfgott & Karas

[57] ABSTRACT

An automatic phase controlling circuit according to the present invention has a phase shifter and an auxiliary detector for producing a sensitizing signal in association with a signal loop constituted by a main detector for producing a control signal and a voltage-controlled oscillator for producing a variable-phase signal, and the sensitizing signal is delayed in phase from the control signal by about 90 degrees by virtue of the phase shifter, so that the main detector achieves a stability around a phase difference of 0 degree without sacrifice of quick response characteristics at a large difference in phase between the variable-phase signal and a reference signal.

12 Claims, 5 Drawing Sheets

AUTOMATIC PHASE CONTROLLING CIRCUIT

FIELD OF THE INVENTION

This invention relates to an automatic phase controlling circuit operative to allow a signal variable in phase to synchronize with a reference signal.

DESCRIPTION OF THE RELATED ART

A typical example of the automatic phase controlling circuit is illustrated in FIG. 1 of the drawings, and comprises a low pass filter circuit (abbreviated as LPF) 1, a voltage-controlled oscillator (abbreviated as VCO) 2, and a detector (abbreviated as DET) 3. The detector 3 is of the double-balanced type, and produces a control signal 4 the voltage level of which is variable depending upon a difference in phase between a variable-phase signal 5 and a reference signal 6 as shown in FIG. 2. The control signal 4 has a sawtooth waveform depending upon the difference in phase between the variable-phase signal 5 and the reference signal 6, and the variable-phase signal 5 is synchronized with the reference signal at a matching point A. However, if a difference in phase takes place between the variable-phase signal 5 and the reference signal 6, the voltage-controlled oscillator 2 advances or retards the variable-phase signal 5 with the control signal 4. In FIG. 2, arrows are representative of a controlling direction where the variable-phase signal 5 is delayed or advanced, and the length of each arrow is indicative of the magnitude of controlling power over the matching operation.

When the variable-phase signal 5 as well as the reference signal are supplied to the detector 3, the detector 3 produces the control signal 4 in accordance with the characteristics shown in FIG. 2, and the control signal 4 is supplied through the low pass filter circuit 1 to the voltage-controlled oscillator 2 so as to match the variable-phase signal 5 with the reference signal 6. If the variable-phase signal 5 is properly synchronized with the reference signal 6 without any delay or advance, the difference in phase is zero as represented by the matching point A in FIG. 2, and, accordingly, the control signal 4 remains in zero level, thereby allowing the voltage-controlled oscillator 2 to produce the variable-phase signal 5 without any variation in phase. However, if the variable-phase signal 5 is deviated in phase from the reference signal, the detector 3 produces the control signal 4 in accordance with the characteristics shown in FIG. 2. With the control signal 4 from the detector 3, the voltage-controlled oscillator 2 retards o advance the variable-phase signal, and, consequently the variable-phase signal is matched in phase with the reference signal.

However, a problem is encountered in the prior art automatic phase controlling circuit in optimization of the response characteristics. In detail, the magnitude of the controlling power is not constant throughout the operation range as described hereinbefore. If the difference in phase is small at or in the vicinity of the matching point A, a small controlling power matches the variable-phase signal 5 with the reference signal 6, however, when a large difference in phase takes place, a large controlling power needs to decrease the difference. On the other hand, the sensitivity of the detector 3 is substantially constant throughout the operation range. In this situation, when the sensitivity is adjusted to a low level so as to provide a stability to the operation around the matching point, a large amount of time is consumed to match the variable-phase signal at a large difference in phase with the reference signal. However, if the sensitivity is large enough to rapidly match the variable-phase signal 5 at the large difference with the reference signal, the magnitude of the controlling power becomes too large to match the variable-phase signal 5 around the matching point A with the reference signal 6, and, consequently, the matching operation is deficient in the stability. Thus, there is a trade-off between the stability and the time consumed, and, for this reason, the response characteristics are hardly optimized.

SUMMARY OF THE INVENTION

It is therefore an important object of the present invention to provide an automatic phase controlling circuit which is easily optimized in the response characteristics.

It is also another important object of the present invention to provide an automatic phase controlling circuit which has a stability around the matching point without sacrifice of quick response characteristics at a large difference in phase from the matching point.

To accomplish the object, the present invention proposes to modify the sensitivity of the detector depending upon the difference in phase from the matching point.

In accordance with one aspect of the present invention, there is provided an automatic phase controlling circuit for matching a variable-phase signal with a reference signal comprising a) a main signal loop having a main detector for producing a control signal representative of a first difference in phase between the variable-phase signal and the reference signal, and a voltage-controlled oscillator responsive to the control signal and producing the variable-phase signal, and b) a sensitivity modifying unit having a phase shifter operative to change the variable-phase signal in phase by a predetermined value to produce a modified variable-phase signal, and an auxiliary detector for producing a sensitizing signal representative of a second difference in phase between the modified variable-phase signal and the reference signal, in which the sensitizing signal is supplied to the main detector so that a sensitivity thereof is minimized around the first difference of about zero degree, but is increased by increasing the first difference in phase.

In accordance with another aspect of the present invention, there is provided an automatic phase controlling circuit for matching a frequency modified variable-phase signal with a reference signal comprising a) an oscillator producing the reference signal, b) a main signal loop having a main detector for producing a control signal representative of a first difference in phase between the frequency modified variable-phase signal and the reference signal, a voltage-controlled oscillator responsive to the control signal and producing a variable-phase signal, and a frequency changer operative to change the frequency of the variable-phase signal to produce the frequency modified variable-phase signal, and c) a sensitivity modifying unit having a phase shifter operative to change the reference signal in phase by a predetermined value to produce a modified reference signal, and an auxiliary detector for producing a sensitizing signal representative of a second difference in phase between the modified reference signal and the frequency modified variable-phase signal, in which the sensitizing signal is supplied to the main detector so that a sensitivity thereof is minimized around the first difference of about zero degree, but is increased by increasing the first difference in phase.

BRIEF DESCRIPTION OF THE DRAWINGS

The features and advantages of an automatic phase controlling circuit according to the present invention will be more clearly understood from the following description taken in conjunction with the accompanying drawings in which.

DESCRIPTION OF THE PREFERRED EMBODIMENTS

First Embodiment

Figure 3:
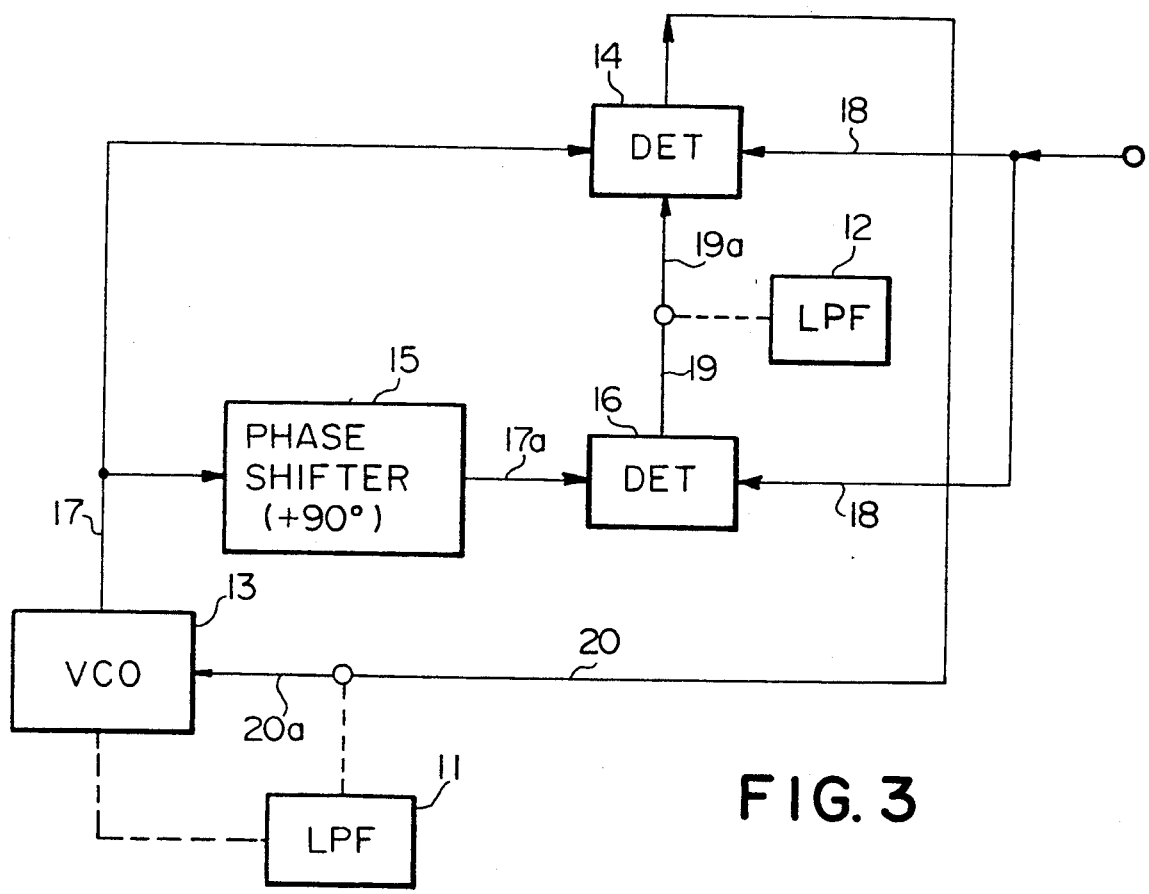
FIG. 3 is a block diagram showing the arrangement of an automatic phase controlling circuit embodying the present invention.
Figure 4:
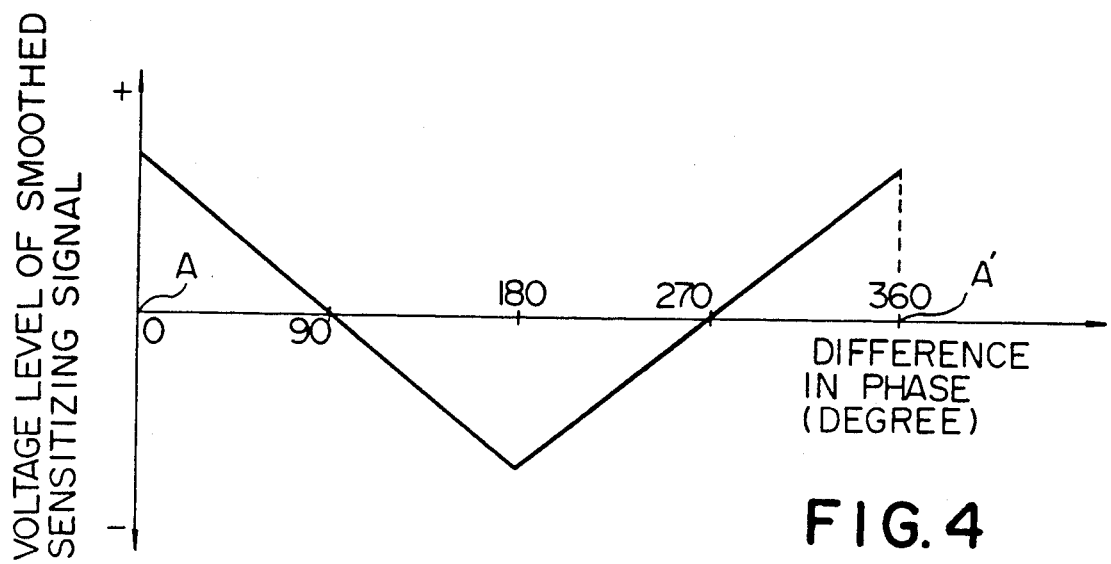
FIG. 4 is a diagram showing the waveform of a sensitizing signal produced in the automatic phase controlling circuit shown in FIG. 3.

Referring first to FIG. 3 of the drawings, an automatic phase controlling circuit according to the present invention largely comprises two low pass filter circuits 11 and 12, a voltage-controlled oscillator 13, a first or main detector 14, a phase shifter 15, and a second or auxiliary detector 16. The voltage-controlled oscillator 13 produces a variable-phase signal which is supplied in parallel to the main detectors 14 and a phase shifter 15. The phase shifter 15 changes the variable-phase signal 17 in phase by about 90 degrees, and the modified variable-phase signal is compared with a reference signal by the auxiliary detector 16. If a difference in phase takes place between the modified variable-phase signal 17a and the reference signal, the auxiliary detector 16 produces a sensitizing signal 19 depending upon the magnitude of the difference in phase. The sensitizing signal 19 is smoothed by the low pass filter circuit 12, and the smoothed sensitizing signal 19a is supplied to the main detector 14. FIG. 4 shows the waveform of the smoothed sensitizing signal 19a. The sensitivity of the detector 14 is varied by changing the smoothed sensitizing signal 19a. Namely, when the variable-phase signal 17 remains in the matching point A, the smoothed sensitizing signal has the positive maximum value which results in the minimum sensitivity of the detector 14. On the other hand, if the variable-phase signal 17 is deviated from the matching point A toward the difference in phase of 180 degrees, the smoothed sensitizing signal 19a is decreased toward the negative peak value, and the detector 14 obtains the maximum sensitivity at 180 degrees.

The main detector 14 is responsive to the smoothed sensitizing signal 19a to modify the sensitivity thereof, and the variable-phase signal 17 is compared with the reference signal 18 by the main detector 14. If it is found that a difference in phase takes place between the variable-phase signal 17 and the reference signal 18, the main detector 14 produces a control signal 20 which is supplied through the low pass filter circuit 11 to the voltage-controlled oscillator 13. The control signal 20 is smoothed by the low pass filter circuit 11, and the smoothed control signal 20a varies the voltage level thereof depending upon the magnitude of the difference in phase between the variable-phase signal 17 and the reference signal 18 as shown in FIG. 5.

Figure 1:
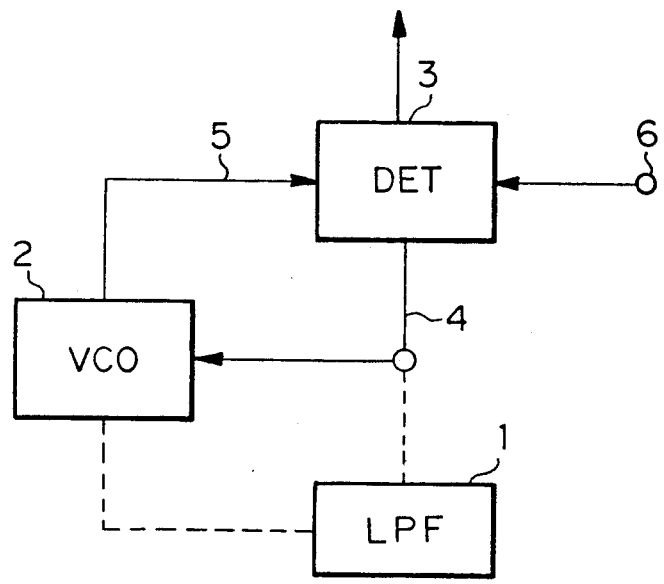
FIG. 1 is a block diagram showing the arrangement of a prior art automatic phase controlling circuit.
Figure 2:
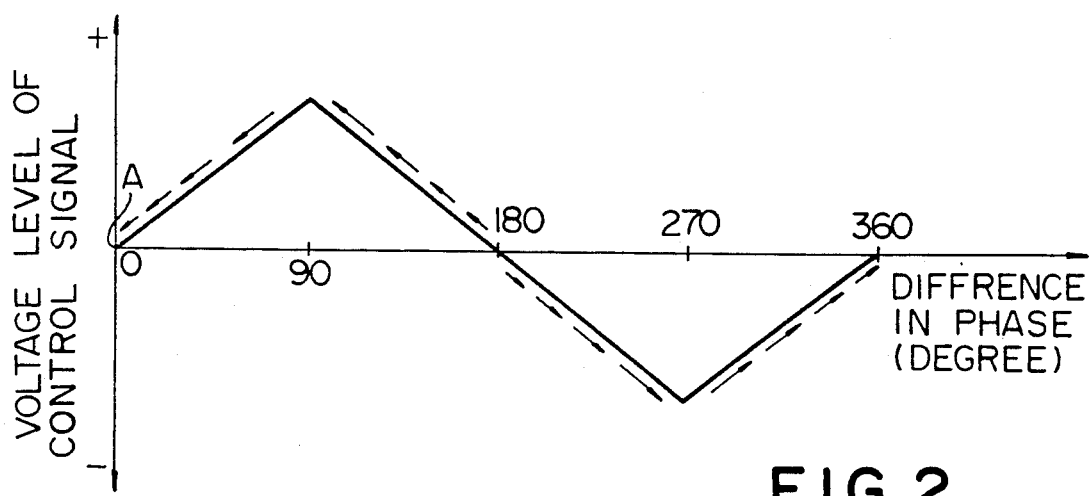
FIG. 2 is a diagram showing the waveform of the control signal, in terms of the difference in phase, produced by the detector incorporated in the prior art automatic phase controlling circuit.
Figure 5:
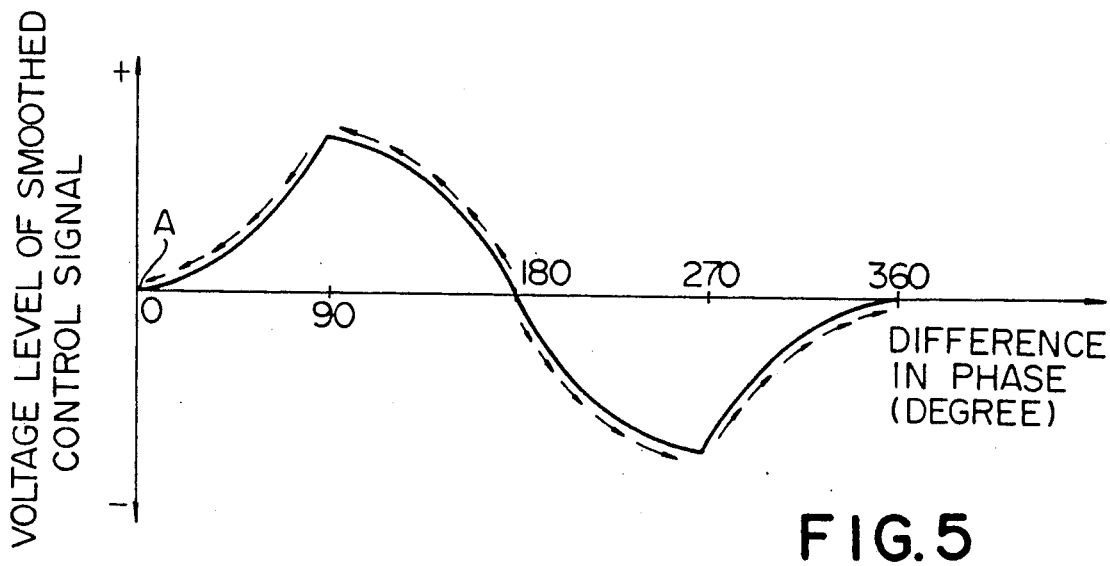
FIG. 5 is a diagram showing the waveform of a control signal produced in the automatic phase controlling circuit shown in FIG. 3.

As it will be seen from comparison of FIG. 2 with FIG. 5, the control signal 20a of the circuit according to the invention is different from the control signal 5 of the prior art. In the invention, even if the output signal 17 of the voltage-controlled oscillator 13 is somewhat different in phase from the reference signal 18, i.e. the difference in phase between those signals is deviated from 0 degree or 360 degrees, the variation in level of the control signal 20a is relatively small. However, when the difference in phase between those signals is slightly deviated from 180 degrees, the level of the control signal 20 is widely changed. This occurs because of the fact that the main detector 14 changes its sensitivity with the smoothed sensitizing signal 19a from the auxiliary detector 16 and that the auxiliary detector 16 controls the sensitizing signal 19 depending upon the difference in phase between the phase signal 17 of the voltage-controlled oscillator 13 and the reference signal 18. Namely, the smoothed sensitizing signal 19a traces the waveform shown in FIG. 4 depending upon the difference in phase between the phase signal 17 and the reference signal 18. However, the main detector 14 has the maximum sensitivity to the smoothed sensitizing signal 19a at the phase difference of 180 degrees and minimizes it at 0 and 360 degrees as described hereinbefore. This means that the sensitivity to the variation in level of the smoothed sensitizing signal 19a is decreased from the maximum value to the minimum value by changing the phase difference from 180 degrees to 0 (or 360) degrees. It should be noted that the phase difference of 0 degrees is equivalent to the phase difference of 360 degrees. While the sensitivity is small, the output signal of the detector is less affected by the phase difference of the target signal from the reference signal. However, an increased sensitivity results in the opposite tendency to the above, and the output of the detector quickly responds to a small phase difference of the target signal. Consequently, the smoothed control signal 20a behaves as shown in FIG. 5, and the automatic phase controlling circuit according to the present invention is stable as long as the phase difference between the variable-phase signal 17 and the reference signal 18 remains in the vicinity of the matching points A and A', respectively, indicative of the phase differences of 0 and 360 degrees. However, if the phase difference is widely spaced from the matching point A or A', the automatic phase controlling circuit widely varies the smoothed control signal 20a and causes the phase difference to be quickly matched with the point A.

Figure 6:
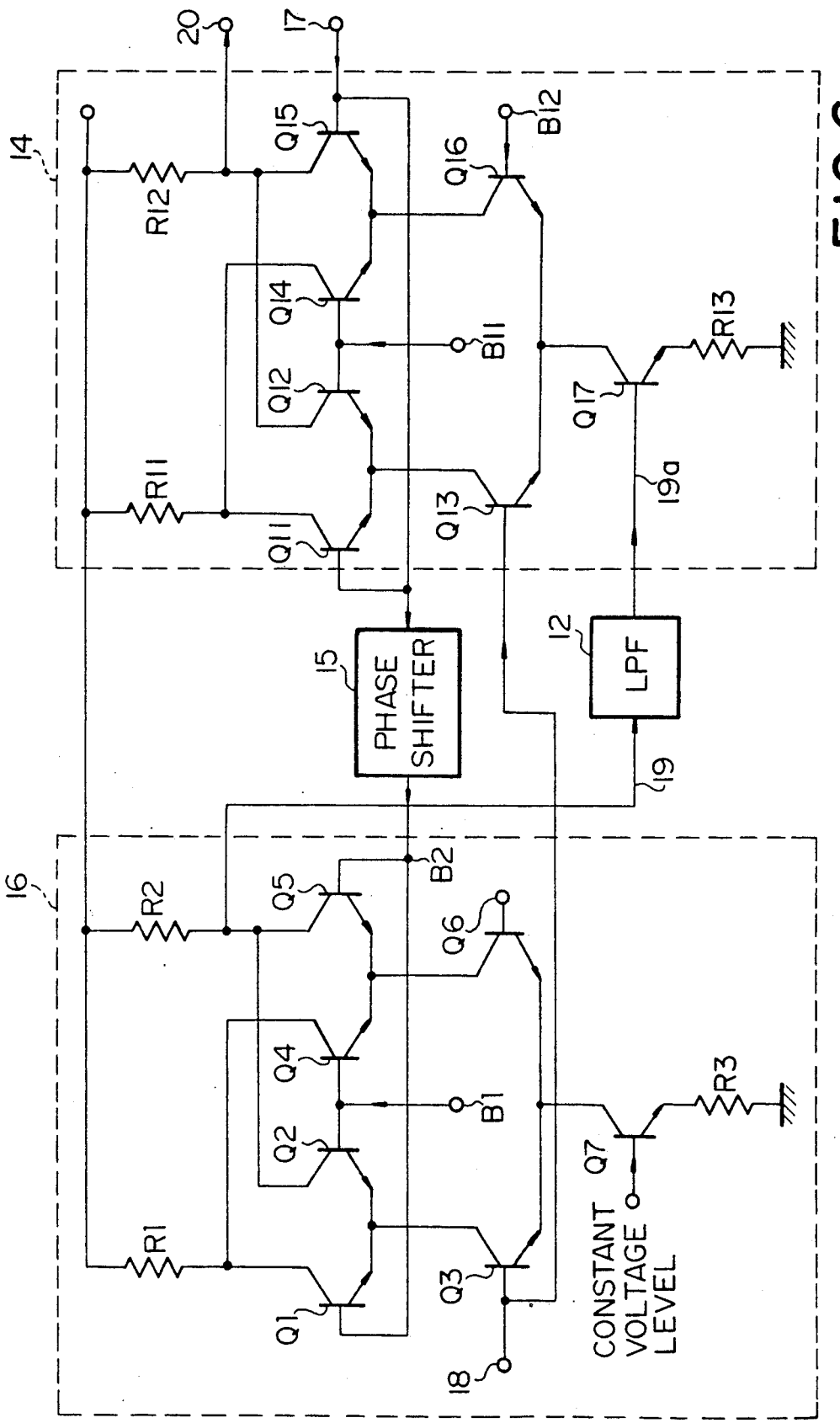
FIG. 6 is a circuit diagram showing the detailed arrangement of an example of the detectors incorporated in the automatic phase controlling circuit shown in FIG. 3.

FIG. 6 illustrates a detailed circuit arrangement of an example of the detectors 14 and 16. The detector 14 comprises a two stage difference amplifier circuit formed by a combination of bipolar transistors Q11 to Q17 and resistors R11 to R13, and biasing nodes B11 and B12 are provided in the two stage difference amplifier circuit. Similarly, the detector 16 comprises a two stage difference amplifier circuit formed by a combination of bipolar transistors Q1 to Q7 and resistors R1 to R3 biasing nodes B1 and B2 are also provided in the two stage difference amplifier circuit. The bipolar transistor Q7 of the detector 16 is supplied at the base node thereof with a constant voltage level so that the detector 16 achieves a constant gain.

The transistor Q17 of the detector 14 is supplied not with a constant voltage level but with the smoothed sensitizing signal 19a from the detector 16 through the low pass filter 12. Therefore, the current passing through the transistor Q17 is varied with the level of the smoothed sensitizing signal 19a. Since the transistor Q17 serves as a source of current, the transistors Q11 and Q15 behave as difference transistors and vary the sensitivity by controlling the current. In this instance, the detector 14 is implemented by NPN transistors, and, for this reason, the smoothed sensitizing signal 19a of FIG. 4 is inverted in polarity by an inverting amplifier (not shown) before reaching the transistor Q17. If other than the smoothed sensitizing signal 19a of FIG. 4 is directly supplied to the detector, the component transistors Q11 to Q17 should be of the PNP type. Thus, the polarity of the signals shown in FIGS. 4 and 5 and/or the arrangement of each detector 14 or 16 are changeable depending upon the automatic phase controlling circuit according to the present invention. In this instance, since the polarity of the smoothed sensitizing signal 19a of FIG. 4 is inverted before reaching the transistor Q17, the collector current of the transistor Q17 is maximized at the phase difference of 180 degrees between the variable-phase signal 17 of the voltage-controlled oscillator 13 and the reference signal 18, and the detector 14 behaves with the maximal sensitivity. On the other hand, the detector 14 decreases the collector current to the minimal value at the phase difference of 0 or 360 degrees, and the sensitivity thereof is minimized. The phase shifter 15 shifts the phase of the output signal 17 of the voltage-controlled oscillator 13 in such a manner that the detector associated with the voltage-controlled oscillator 13 increases the sensitivity together with the phase difference from the matching point A, and, for this reason, is coupled to either detector 14 or 16 depending upon the arrangement of the automatic phase controlling circuit of the detector.

Second Embodiment

Figure 7:
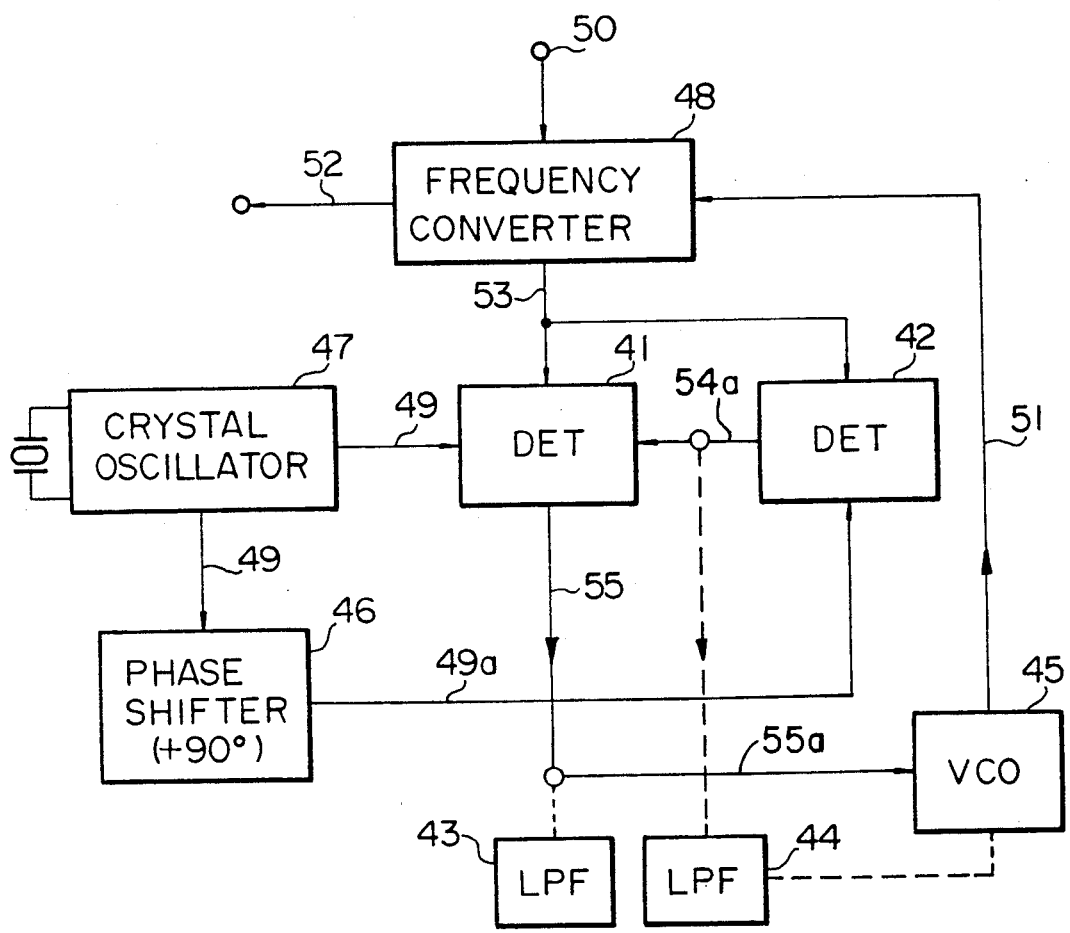
FIG. 7 is a block diagram showing the arrangement of another automatic phase controlling circuit embodying the present invention.

Turning to FIG. 7 of the drawings, another automatic phase controlling circuit according to the present invention is applied to a color signal processing unit incorporated in a video tape recorder system. The automatic phase controlling circuit shown in FIG. 7 largely comprises two detectors 41 and 42, two low pass filter circuits 43 and 44, a voltage-controlled oscillator 45, a phase shifter 46, a crystal oscillator 47, and a frequency converter 48. The crystal oscillator 47 produces a reference signal 49 directly supplied to the detector 41, and the phase shifter 46 changes the reference signal 49 in phase by about 90 degrees to produce a modified reference signal 49a. The detectors 41 and 42 are respectively supplied with the reference signal 49 and the modified reference signal 49a as well as an input signal 50 through the frequency converter 48 which further carries out the frequency converting operation on a variable-phase signal 51 fed from the voltage-controlled oscillator 45.

While the frequency converter 48 produces an output signal 52 by eliminating a jitter component (which is given to the variable-phase signal 51) from the input signal 50, the detector 41 is responsive to the smoothed sensitizing signal 54a and changes the sensitivity thereof. The smoothed sensitizing signal 54a is produced through the smoothing operation of the low pass filter circuit 44. The detector 41 is operative at the controlled sensitivity and produces the control signal 55 depending upon the phase difference between the signals 53 and 49. The control signal 55 is smoothed at the low pass filter circuit 43 and supplied to the voltage-controlled oscillator 45 as a control signal 55a. The second embodiment is different from the first embodiment. Namely, the input signal 53 is supplied to the detectors 41 and 42, and the reference signal 49 and the modified reference signal 49a different in phase from the reference signal by 90 degrees are respectively supplied to the detectors 41 and 42. However, the signals compared by the detectors 41 and 42 are in a similar relation to those of the first embodiment and the signals 54a and 55a are substantially identical with those shown in FIGS. 4 and 5. For this reason, the detector 41 minimizes the sensitivity at the matching point, i.e. 0 or 360 degrees, and compares the phase of the input signal 53 with the phase of the reference signal 49. However, the sensitivity of the detector 41 is maximized at the phase difference of 180 degrees.

In operations, the input signal 53 is supplied to the detector 41, and the detector 41 decides whether or not any difference in phase takes place between the input signal 53 and the reference signal 49 fed from the crystal oscillator 47. On the other hand, the modified reference signal 49a is supplied to the detector 42 and compared with the input signal 53 to produce the sensitizing signal 54. The detector 41 is responsive to the sensitizing signal 54 so that the sensitivity thereof is modified in accordance with the difference in phase between the modified reference signal 49a and the input signal 50. The detector 41 decides whether or not any difference in phase takes place between the input signal 53 and the reference signal 49, and produces the control signal 55 in the presence of the difference in phase under the sensitivity decided by the sensitizing signal 54. The control signal 55 is fed to the voltage-controlled oscillator 45, and the voltage-controlled oscillator 45 is responsive to the control signal 55 to produce the variable-phase signal 51. Thus, the variable-phase signal 51 is subjected to the modification similar to the input signal 50, and, for this reason, the output signal 52 is stable even if the jitter component rides on the input signal 50.

As will be understood from the foregoing description, the automatic phase controlling circuit according to the present invention is advantageous over the prior art circuit in the stability around the matching point without sacrifice of the quick response characteristics at a large difference in phase by virtue of the sensitizing signal produced by the combination of the phase shifter and the auxiliary detector.

Although particular embodiments of the present invention have been shown and described, it will be obvious to those skilled in the art that various changes and modifications may be made without departing from the spirit and scope of the present invention.

What is claimed is:

1. An automatic phase controlling circuit for matching a variable-phase signal with a reference signal comprising
    a) a main signal loop having a main detector for producing a control signal representative of a first difference in phase between said variable-phase signal and said reference signal, and a voltage-controlled oscillator responsive to said control signal and producing said variable-phase signal, and
    b) a sensitivity modifying unit having a phase shifter operative to change said variable-phase signal in phase by a predetermined value to produce a modified variable-phase signal, and an auxiliary detector for producing a sensitizing signal representative of a second difference in phase between the modified variable-phase signal and said reference signal, in which said sensitizing signal is supplied to said main detector so that a sensitivity thereof is minimized around the first difference of about zero degree, but is increased by increasing the first difference in phase.

2. An automatic phase controlling circuit as set forth in claim 1, in which said predetermined value is about 90 degrees.

3. An automatic phase controlling circuit as set forth in claim 2, in which said main signal loop further has a first low pass filter circuit operative to smooth the control signal.

4. An automatic phase controlling circuit as set forth in claim 3, in which said sensitivity modifying unit further has a second low pass filter circuit operative to smooth the sensitizing signal.

5. An automatic phase controlling circuit for matching a frequency modified variable-phase signal with a reference signal comprising
    a) an oscillator producing said reference signal,
    b) a main signal loop having a main detector for producing a control signal representative of a first difference in phase between said frequency modified variable-phase signal and said reference signal, a voltage-controlled oscillator responsive to said control signal and producing a variable-phase signal, and a frequency converter operative to change the frequency of the variable-phase signal to produce said frequency modified variable-phase signal, and
    c) a sensitivity modifying unit having a phase shifter operative to change said reference signal in phase by a predetermined value to produce a modified reference signal, and an auxiliary detector for producing a sensitizing signal representative of a second difference in phase between the modified reference signal and said frequency modified variable-phase signal, in which said sensitizing signal is supplied to said main detector so that a sensitivity thereof is minimized around the first difference of about zero degree, but is increased by increasing the first difference in phase.

6. An automatic phase controlling circuit as set forth in claim 5, in which said predetermined value is about 90 degrees.

7. An automatic phase controlling circuit as set forth in claim 6, in which said main signal loop further has a first low pass filter circuit operative to smooth the control signal.

8. An automatic phase controlling circuit as set forth in claim 7, in which said sensitivity modifying unit further has a second low pass filter circuit operative to smooth the sensitizing signal.

9. An automatic phase controlling circuit as set forth in claim 8, in which said frequency converter is further operative to produce an output signal thereof by eliminating an jitter component from an input signal, and said jitter component is also contained in said variable-phase signal.

10. An automatic phase controlling circuit comprising:
    a) first phase detector means operative to compare a first signal with a second signal and producing a first control signal indicative of a phase difference between said first and second signals;
    b) second phase detector means operative to compare said second signal with a third signal and producing a second control signal indicative of a phase difference between said second and third signals, said third signal being different in phase from said first signal by a predetermined angle, said second phase detector means having a sensitivity to said phase difference between said second and third signals controlled with said first control signal;
    c) a voltage-controlled oscillator responsive to said second control signal and producing an oscillation signal;
    d) a reference oscillator for producing a reference signal with a predetermined frequency;
    e) means responsive to one of said oscillation signal and said reference signal and producing said first and third signals; and
    f) means responsive to another of said oscillation signal and said reference signal and producing said second signal.

11. An automatic phase controlling circuit as set forth in claim 10, in which said one of said oscillation signal and said reference signal is said oscillation signal.

12. An automatic phase controlling circuit as set forth in claim 10, in which said one of said oscillation signal and said reference signal is said reference signal.

* * * * *